United States Patent
Yajima

[11] Patent Number: 5,945,739
[45] Date of Patent: Aug. 31, 1999

[54] SEMICONDUCTOR DEVICE HAVING A CONDUCTOR THROUGH AN INTER-LEVEL LAYER AND A SPIN-ON-GLASS IN THE INTER-LEVEL LAYER WITH SUBSTANTIALLY PLANAR UPPER SURFACES OF THE CONDUCTOR, THE INTER-LEVEL LAYER, AND THE SPIN-ON-GLASS

[75] Inventor: Takashi Yajima, Tokyo, Japan

[73] Assignee: NEC Corporation, Tokyo, Japan

[21] Appl. No.: 08/892,934

[22] Filed: Jul. 15, 1997

[30] Foreign Application Priority Data

Jul. 16, 1996 [JP] Japan .................................. 8-185830

[51] Int. Cl.$^6$ .................................................. H01L 23/48
[52] U.S. Cl. .......................... 257/758; 257/280; 257/281;
257/700; 257/759; 257/752; 257/753; 257/754;
257/755; 257/756; 257/757; 257/748; 257/781;
257/643; 257/750
[58] Field of Search ...................................... 257/148, 280,
257/281, 401, 700, 750, 752, 756–764,
774, 781, 748, 635–643

[56] References Cited

U.S. PATENT DOCUMENTS

| 5,094,965 | 3/1992 | Ozaki et al. ............................... 438/40 |
| 5,306,947 | 4/1994 | Adachi et al. ........................... 257/759 |
| 5,705,856 | 1/1998 | Wakabayashi ........................... 257/759 |

FOREIGN PATENT DOCUMENTS

| 62-81732 | 4/1987 | Japan . |
| 64-47053 | 2/1989 | Japan . |
| 3-36727 | 2/1991 | Japan . |
| 5-160126 | 6/1993 | Japan . |
| 6-236972 | 8/1994 | Japan . |

OTHER PUBLICATIONS

Japanese Office Action dated May 19, 1998 with English language translation of Japanese Examiner's comments.

Primary Examiner—Fetsum Abraham
Attorney, Agent, or Firm—Whitham, Curtis & Whitahm

[57] ABSTRACT

A multi-layered wiring structure includes a lower wiring having an upper surface, a first inter-level insulating layer having a first flat upper surface substantially coplanar with the upper surface of the lower conductive wiring and a recess contiguous to the first flat upper surface, a spin-on-glass layer filling the recess and having a second flat upper surface substantially coplanar with the first flat upper surface, a second inter-level insulating layer covering the first and second flat surfaces and the upper surface of the lower conductive wiring and an upper conductive wiring extending on the second inter-level insulating layer and passing through a contact hole of the second inter-level insulating layer so as to be held in contact with the lower conductive wiring, and the first and second flat upper surfaces are created through an etch-back using gaseous etchant equally etching the first inter-level insulating layer and the spin-on-glass layer, thereby creating smooth surface under the second inter-level insulating layer.

5 Claims, 5 Drawing Sheets

SEMICONDUCTOR DEVICE HAVING A CONDUCTOR THROUGH AN INTER-LEVEL LAYER AND A SPIN-ON-GLASS IN THE INTER-LEVEL LAYER WITH SUBSTANTIALLY PLANAR UPPER SURFACES OF THE CONDUCTOR, THE INTER-LEVEL LAYER, AND THE SPIN-ON-GLASS

FIELD OF THE INVENTION

This invention relates to a semiconductor device and, more particularly, to a semiconductor integrated circuit device having a multi-layered wiring structure.

DESCRIPTION OF THE RELATED ART

The semiconductor integrated circuit device has been progressively increased in the integration density of circuit components, and conductive wirings are arranged on an inter-level insulating structure at an extremely narrow pitch. If the upper surface of the inter-level insulating structure is waved due to the lower conductive wirings, residual conductive pieces are liable to be left at the steps on the upper surface of the inter-level insulating layer during an etching, and are causative of a short-circuit between the adjacent conductive wirings.

In order to prevent the conductive wirings from the short-circuit, the inter-level insulating structure, which is implemented by an insulating layer laminated with a spin-on-glass layer, is subjected to an etch-back before the deposition of the conductive material. The waved upper surface is smoothed through the etch-back, and the residual conductive pieces are hardly left on the smooth upper surface.

Another smoothing technology is called as "reflow". An insulating layer is covered with a boro-phosphosilicate glass layer, and the boro-phosphosilicate glass layer is heated over 800 degrees in centigrade. The boro-phosphosilicate glass is softened, and reflows so as to form a smooth upper surface. However, if the lower conductive wirings are formed of material with a low melting point such as aluminum, the reflow is hardly applied thereto.

FIG. 1 illustrates a multi-layered wiring structure disclosed in Japanese Patent Publication of Unexamined Application No. 64-47053. A plurality of lower-level conductive wirings 1a and 1b extend on a semiconductor substrate 2, and are covered with a first inter-level insulating layer 3a. The first inter-level insulating layer 3a topographically extends along the surfaces of the lower-level conductive wirings 1a and exposed surfaces of the semiconductor substrate 2 between the lower-level conductive wirings 1a, and is, accordingly, waved. Spin-on-glass 3b fills the recesses defined by the first inter-level insulating layer 3a between the lower-level conductive wirings 1a. Thus, the spin-on glass pieces 3b make the wave of the first inter-level insulating layer 3a small.

A second inter-level insulating layer 3c is formed over the first inter-level insulating layer 3a and the spin-on-glass pieces 3b. A contact hole 3d is formed in the first and second inter-level insulating layers 3a and 3c, and the upper surface of the lower-level conductive wiring 1a is exposed to the contact hole 3c. Though not shown in FIG. 1, an upper-level conductive layer extends on the second inter-level insulating layer 3c, and is held in contact with the lower-level conductive layer 1a.

The prior art multi-layered wiring structure shown in FIG. 1 is fabricated as follows. The lower-level conductive wirings 1a are firstly patterned on the semiconductor substrate 2, and insulating material is deposited over the entire surface of the resultant semiconductor substrate so as to topographically cover the lower-level conductive wirings 1a and the exposed surfaces of the semiconductor substrate 2 with the first inter-level insulating layer 3a by using a chemical vapor deposition.

Subsequently, glass is spun onto the entire surface of the resultant semiconductor structure, and the resultant semiconductor structure is covered with the spin-on-glass layer. The spin-on-glass layer is uniformly etched without an etching mask, and the etchant has a large selectivity to the spin-on-glass rather than the lower inter-level insulating layer 3a. When the first inter-level insulating layer 3a over the lower conductive wirings 1a/1b is exposed, the uniform etching is ended, and the spin-on glass pieces 3b are left in the recesses.

Insulating material is deposited over the entire surface of the resultant semiconductor structure by using a chemical vapor deposition, and the spin-on-glass pieces 3b and the lower inter-level insulating layer 3a are covered with the second inter-level insulating layer 3c.

A photo-resist etching mask is formed on the second inter-level insulating layer 3a, and an area of the second inter-level insulating layer 3c is exposed to an opening of the photo-resist etching mask. Using the photo-resist etching mask, the second inter-level insulating layer 3c and the first inter-level insulating layer 3a are selectively etched away, and the contact hole 3d reaches the upper surface of the lower conductive wiring 1a.

Conductive material is deposited over the entire surface of the resultant semiconductor structure, and the conductive layer is patterned into the upper conductive wiring.

The spin-on-glass layer has been etched away from the areas of the first inter-level insulating layer over the lower conductive wirings 1a before the deposition of the upper conductive wiring 3c, and, for this reason, the upper conductive wiring 3c is prevented from erosive gas emitted from the spin-on-glass pieces 3b.

FIG. 2 illustrates another prior art multi-layered wiring structure disclosed in Japanese Patent Publication of Unexamined Application No. 5-160126. Firstly, the major surface of a semiconductor substrate 6 is covered with a lower insulating layer 7a, and lower conductive wirings 8a/8b are patterned on the lower insulating layer 7a. A first inter-level insulating layer 7b is deposited by using a chemical vapor deposition, and is waved due to the lower conductive wirings 8a/8b. As a result, recesses are defined by the first inter-level insulating layer 7b between the lower conductive wirings 8a and 8b.

Spin-on-glass is spread over the entire surface of the resultant semiconductor structure, and the spin-on-glass layer is etched without an etching mask until the first inter-level insulating layer on the lower conductive wirings 8a/8b is exposed. The etchant does not have selectivity between the spin-on-glass and the first inter-level insulating layer 7b. Upon completion of the etching, residual spin-on glass pieces 7c are left in the recesses.

A second inter-level insulating layer 7d is formed by using a chemical vapor deposition over the entire surface of the resultant semiconductor structure, and a photoresist etching mask is provided on the second inter-level insulating layer 7d. The first and second inter-level insulating layers 7c/7d are selectively etched away so as to form a contact hole 7e. Conductive material is deposited over the second inter-level insulating layer 7d, and an upper conductive wiring 8c is patterned from the conductive material layer. The upper conductive wiring 8c passes through the contact hole 7e, and is held in contact with the lower conductive wiring 8b.

The first prior art disclosed in Japanese Patent Publication of Unexamined Application No. 64-47053 encounters a problem in the flatness of the surface under the second inter-level insulating layer. As shown in FIG. 1, the shallow recesses still take place in the residual spin-on-glass pieces 3b, and the surface under the second inter-level insulating layer 3c is still waved. The reason for the waved surface is that the etchant has the large selectivity to the spin-on-glass.

Another problem of the first prior art is a large aspect ratio of the contact hole 3d. The etchant has the large selectivity to the spin-on-glass with respect to the first inter-level insulating layer 3a. This means that the first inter-level insulating layer 3a is hardly etched during the etch-back, and the contact hole 3d becomes deep. For this reason, the contact hole 3d has the large aspect ratio. The poor flatness and the large aspect ratio do not allow the manufacturer to pattern a fine upper conductive wiring, and the contact resistance tends to be increased.

The surface under the second inter-level insulating layer 7d is flatter than the surface under the second inter-level insulating layer 3c, because the etchant has less selective between the spin-on-glass and the first inter-level insulating layer. However, the contact hole 7e also passes through the first and second inter-level insulating layers 7b/7c, and still has a large aspect ratio. For this reason, the second prior art disclosed in Japanese Patent Publication of Unexamined Application No. 5-160126 has a problem in poor patternability of the upper conductive layer and large contact resistance due to the large aspect ratio.

SUMMARY OF THE INVENTION

It is therefore an important object of the present invention to provide a semiconductor device which has a fine upper conductive wiring connected to a lower conductive wiring without a large contact resistance.

To accomplish the object, the present invention proposes to expose an upper surface of a lower conductive layer before a deposition of a second inter-level insulating layer.

In accordance with the present invention, there is provided a semiconductor device fabricated on a semiconductor substrate, comprising: at least one lower conductive wiring extending over the semiconductor substrate, and having side surfaces and an upper surface; a first inter-level insulating layer held in contact with the side surfaces of the at least one lower conductive wiring, and having a first flat upper surface substantially coplanar with the upper surface of the at least one lower conductive wiring and a curved upper surface contiguous to the first flat upper surface and depressed toward the semiconductor substrate; a spin-on-glass layer filling a space defined by the curved upper surface, and having a second flat upper surface substantially coplanar with the first flat upper surface; a second inter-level insulating layer formed on the first and second flat surfaces and the upper surface of the at least one lower conductive wiring, and having a contact hole to which the at least one lower conductive wiring is exposed; and an upper conductive wiring extending on the second inter-level insulating layer, and passing through the contact hole so as to be held in contact with the at least one lower conductive wiring.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

FIGS. 3A to 3D illustrates a process of fabricating a semiconductor device embodying the present invention. Although only a multi-layered wiring structure is shown, a plurality of circuit components such as field effect transistors are incorporated in the semiconductor device, and are connected through the multi-layered wiring structure. In the following description, term "aluminum" means both pure aluminum and aluminum alloy.

Figure 1:
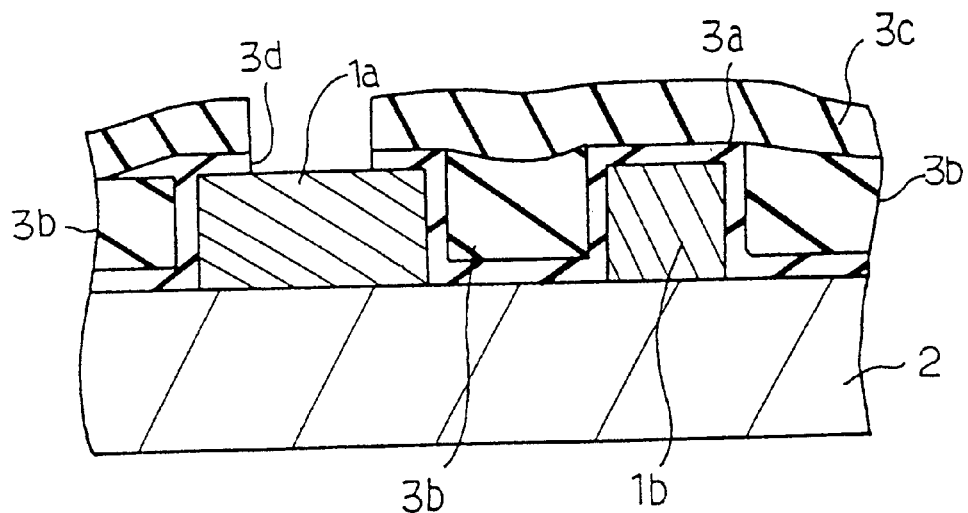
FIG. 1 is a cross sectional view showing the structure of the prior art multi-layered wiring structure disclosed in Japanese Patent Publication of Unexamined Application No. 64-47053.
Figure 2:
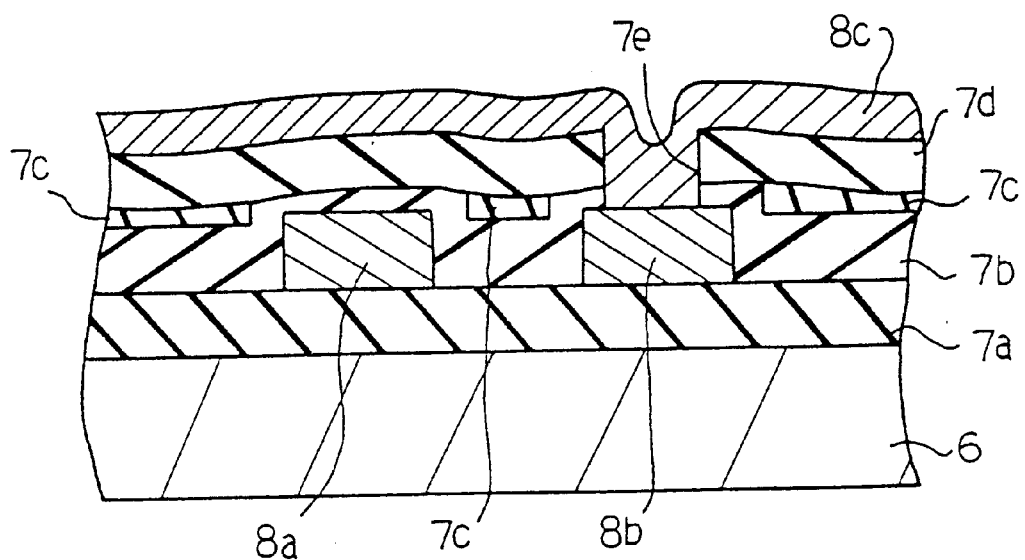
FIG. 2 is a cross sectional view showing the structure of the prior art multi-layered wiring structure disclosed in Japanese Patent Publication of Unexamined Application No. 5-160126.
Figure 3A:
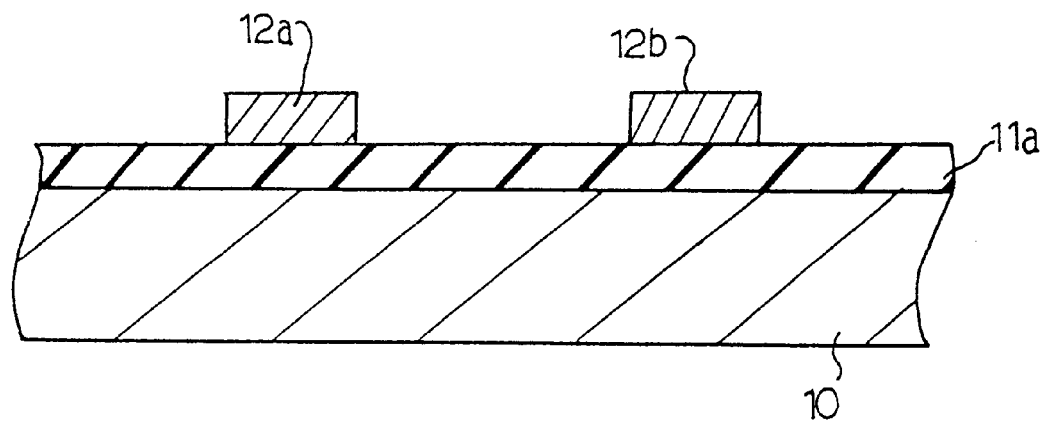
FIGS. 3A to 3D are cross sectional views showing a process of fabricating a multi-layered wiring structure incorporated in a semiconductor device according to the present invention.

The process starts with preparation of a semiconductor substrate 10, and the semiconductor substrate 10 is covered with a lower insulating layer 11a of 400 nanometers to 500 nanometers thick. Aluminum is deposited to 500 nanometers to 600 nanometers thick over the lower insulating layer 11a, and photo-resist solution is spun onto the aluminum layer. The photo-resist is baked so as to form a photo-resist layer, and a pattern image is transferred from a photo-mask (not shown) to the photo-resist layer. As a result, a latent image is formed in the photo-resist layer. The latent image is developed, and a photo-resist etching mask (not shown) is formed on the aluminum layer. Using the photo-resist etching mask, the aluminum layer is selectively etched away so as to form lower conductive wirings 12a and 12b. Thus, the lower conductive wirings 12a/12b are patterned from the aluminum layer by using lithographic techniques and the etching. The resultant semiconductor structure is shown in FIG. 3A.

Silicon oxide is deposited to 400 nanometers to 500 nanometers thick over the entire surface of the resultant semiconductor structure by using a plasma-exited chemical vapor deposition, and the lower conductive wirings 12/12b and the lower conductive layer 12a are topographically covered with a first inter-level insulating layer 11b of the silicon oxide. The first inter-level insulating layer 11b is waved due to the lower conductive wirings 12a/12b.

Figure 3B:
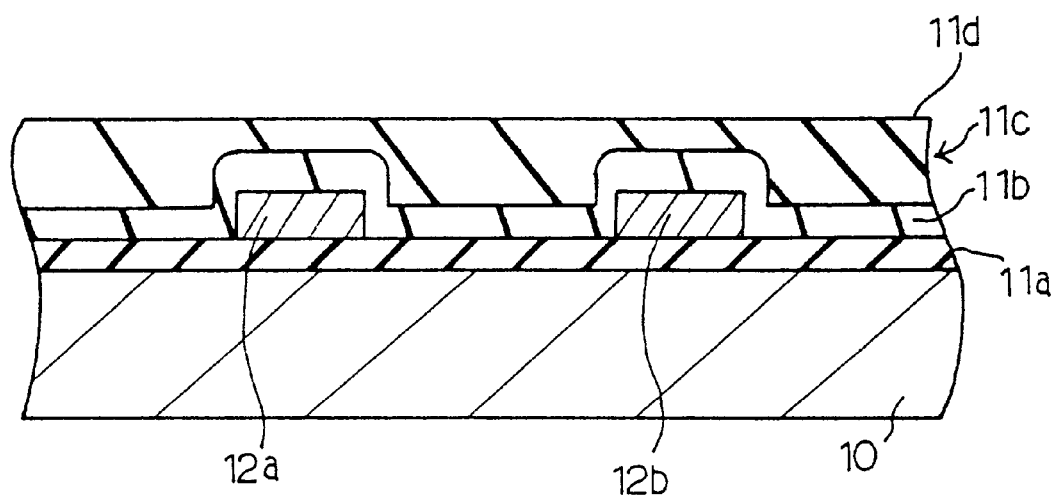

Subsequently, silica is spun onto the first inter-level insulating layer 11b, and form a spin-on-glass layer 11c of 300 nanometers to 400 nanometers thick on the first inter-level insulating layer 11b. The spin coating creates a smooth top surface 11d of the spin-on-glass layer 11c as shown in FIG. 3B.

The spin-on-glass layer 11c and the first inter-level insulating layer 11c are etched back or uniformly etched without an etching mask until the lower conductive wirings 12/12b are exposed. Tetrafluoromethane ($CF_4$) and trifluoromethane ($CHF_3$) are mixed with carrier gas of argon, and form gaseous etchant used in the etch-back. The tetrafluoromethane, the trifluoromethane and argon are, by way of example, regulated to 20 sccm, 20 sccm and 300 sccm, and the etching rate to the spin-on-glass layer 11d is approximately equal to the etching rate to the first inter-level insulating layer 11b. If only tetrafluoromethane ($CF_4$) is mixed with the carrier gas, the gaseous etchant has the etching rate to the spin-on-glass layer 11c larger than the etching rate to the first inter-level insulating layer 11b. However, when trifluoromethane ($CHF_3$) is mixed together with tetrafluoromethane, the gaseous etchant is liable to produce hydrocarbon polymer during the etching, and the hydrocarbon polymer makes the etching rate to the spin-on-glass layer 11c and the etching rate to the first inter-level insulating layer 11b approximately equal. The lower conductive wirings 12a/12b of the aluminum are hardly etched by the gaseous etchant.

Figure 3C:
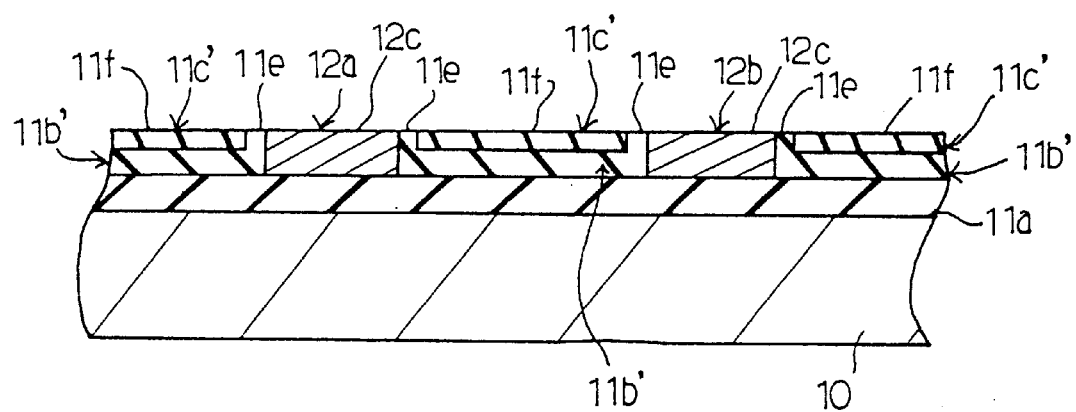

When the lower conductive wirings 12a/12b are exposed, the spin-on-glass layers 11c ' are left in the shallow recesses in the first inter-level insulating layers 11b', and the upper surfaces 11e of the first inter-level insulating layers 11b' and the upper surfaces 11f of the spin-on-glass layers 11c' are substantially coplanar with the upper surfaces 12c of the lower conductive wirings 12a/12b as shown in FIG. 3C. The gaseous etchant never forms a shallow recess in the spin-on-glass layers 11c' by virtue of the equality between the etching rate to the spin-on-glass layer 11c and the etching rate to the first inter-level insulating layer 11b.

Subsequently, silicon oxide is deposited to 400 nanometers to 500 nanometers thick over the entire surface of the resultant semiconductor structure by using a plasma-exited chemical vapor deposition, and a second inter-level insulating layer 11g of the silicon oxide is formed on the flat surfaces 11e/11f/12c. A contact hole 11h is formed in the second inter-level insulating layer 11g by using the lithographic techniques and the etching. The contact hole 11h penetrates through the second inter-level insulating layer 11g, and the upper surface of the lower conductive wiring 12b is exposed to the contact hole 11h.

Figure 3D:
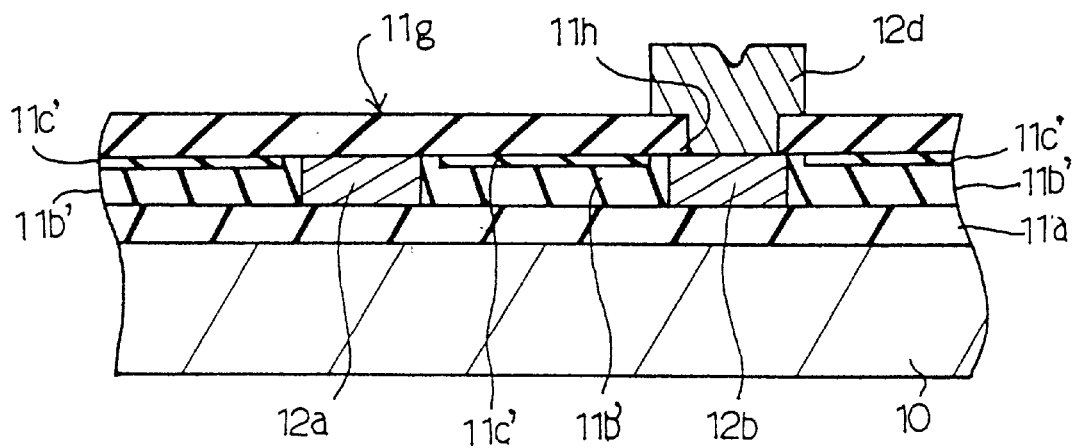

Aluminum is deposited over the entire surface of the resultant semiconductor structure. The aluminum fills the contact hole 11h, and swells into an aluminum layer of 800 nanometers to 1000 nanometers thick. An upper conductive wiring 12d is patterned from the aluminum layer by using the lithographic techniques and the etching as shown in FIG. 3D.

The first inter-level insulating layers 11b' and the second inter-level insulating layer 11g intervene between the lower conductive wirings 12a/12b and the upper conductive wiring 12d. As described hereinbefore, the flat surface is created beneath the second inter-level insulating layer 11g, and the flatness is transferred to the upper surface of the second inter-level insulating layer 11g. For this reason, the aluminum layer is precisely patterned into the upper conductive wiring 12d. Thus, the process according to the present invention is improved in patternability of the upper conductive wiring 12d, and the fine upper conductive wiring 12d is formed on the second inter-level insulating layer without an undesirable short-circuit.

Moreover, the contact hole 11h passes through only the second inter-level insulating layer 11g, and the aspect ratio is smaller than that of the prior art. For this reason, the contact resistance is improved.

Second Embodiment

FIGS. 4A to 4D shows another process embodying the present invention. One-transistor one-capacitor type dynamic random access memory cells are fabricated on a semiconductor substrate through the process implementing the second embodiment.

A p-type silicon substrate 20 is selectively covered with a field oxide layer 21a of 400 nanometers to 500 nanometers thick, and gate oxide layers 21b of 10 nanometers to 15 nanometers thick are grown on the exposed surfaces of the p-type silicon substrate 20.

Polysilicon is deposited to 200 nanometers to 300 nanometers thick over the entire surface of the resultant structure, and the polysilicon layer is patterned into word lines 22a and other conductive wirings 22b by using the lithographic techniques and the etching. The word lines 22a serve as gate electrodes of switching transistors of dynamic random access memory cells, and conductive wirings 22b serve as gate electrodes of field effect transistors of a peripheral circuit.

Using the word lines 22a, the conductive wirings 22b and the field oxide layer 21a as an ion-implantation mask, arsenic is, by way of example, ion implanted into the p-type silicon substrate 20, and heavily doped n-type source/drain regions 22c are formed in the p-type silicon substrate 20.

Subsequently, a first inter-level insulating layer 23a is deposited to 300 nanometers to 400 nanometers thick over the entire surface of the resultant semiconductor structure. A bit contact hole 23b is formed in the first inter-level insulating layer 23a, and the heavily doped n-type source/drain region 23b is exposed to the bit contact hole 23b.

Tungsten silicide ($WSi_2$) is deposited to 200 nanometers to 300 nanometers thick over the entire surface of the resultant semiconductor structure by using a sputtering, and the tungsten silicide layer is patterned into bit lines 22d and conductive wirings 22e. The bit line 22d is held in contact with the source/drain region 22c through the bit contact hole 23b.

Subsequently, a second inter-level insulating layer 23c is deposited to 400 nanometers to 500 nanometers thick over the entire surface of the resultant semiconductor structure, and a node contact hole 23d is formed in the first and second inter-level insulating layers 23a and 23c. The heavily doped n-type source/drain region 22c is exposed to the node contact hole 23d.

Polysilicon is deposited to 300 nanometers to 400 nanometers thick over the second inter-level insulating layer 23c by using a low-pressure chemical vapor deposition, and the polysilicon layer is patterned into accumulating electrodes 22d of storage capacitors. The accumulating electrodes 22d are held in contact with the heavily doped n-type source/drain regions 22c through the node contact holes 23d. The accumulating electrodes 22d are covered with dielectric films 22e, respectively, and the dielectric film 22e is equivalent to 6 nanometers to 8 nanometers thick. Polysilicon is deposited to 100 nanometers to 200 nanometers thick over the entire surface of the resultant semiconductor structure, and the polysilicon layer is patterned into counter electrodes 22f.

A third inter-level insulating layer 23e is deposited to 400 nanometers to 500 nanometers thick over the entire surface of the resultant semiconductor structure, and contact holes (not shown) are formed by using the lithographic techniques and the etching. The contact holes (not shown) pass through the first, second and third inter-level insulating layers 23a, 23c and 23e, and reach the upper surfaces of the word lines 22a.

Figure 4A:
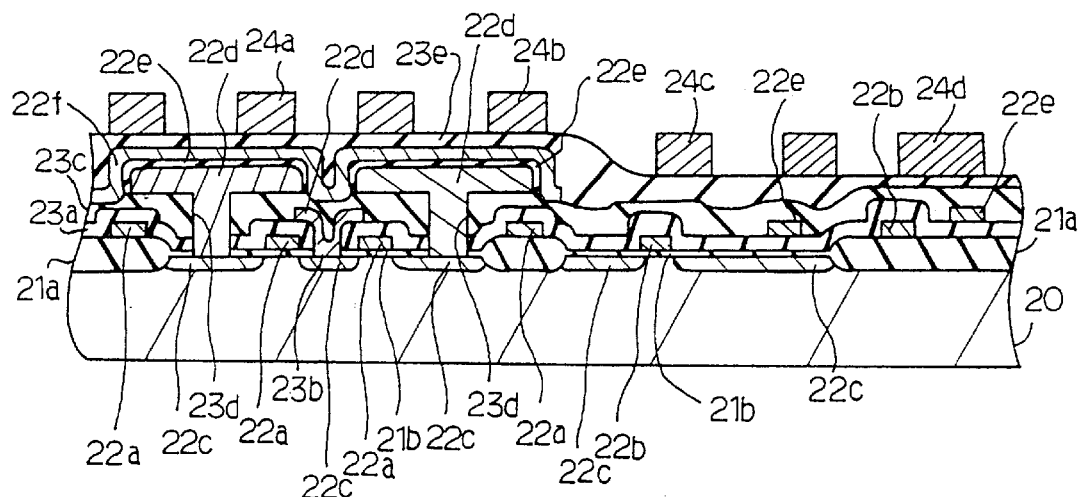
FIGS. 4A to 4D are cross sectional views showing another process of fabricating a semiconductor dynamic random access memory device according to the present invention.

Aluminum is deposited to 500 nanometers to 600 nanometers thick over the third inter-level insulating layer 23e, and the aluminum layer is patterned into lower conductive lines 24a, 24b, 24c and 24d by using the lithographic techniques and the etching as shown in FIG. 4A. The lower conductive lines 24a and 24b are held in contact with the word lines 22a through the contact holes formed in the first to third inter-level insulating layers 23a/23c/23e. The lower conductive wirings 24a/24b are expected to reduce the resistance of the word lines 22a.

Subsequently, silicon oxide is deposited over the entire surface of the resultant semiconductor structure by using plasma-excited chemical vapor deposition, and the lower conductive wirings 24a to 24d are covered with a fourth inter-level insulating layer 23f. The fourth inter-level insulating layer 23f topographically extends over the third inter-level insulating layer 23e and the lower conductive wirings 24a to 24d, and is waved due to the lower conductive wirings 24a to 24d.

Figure 4B:
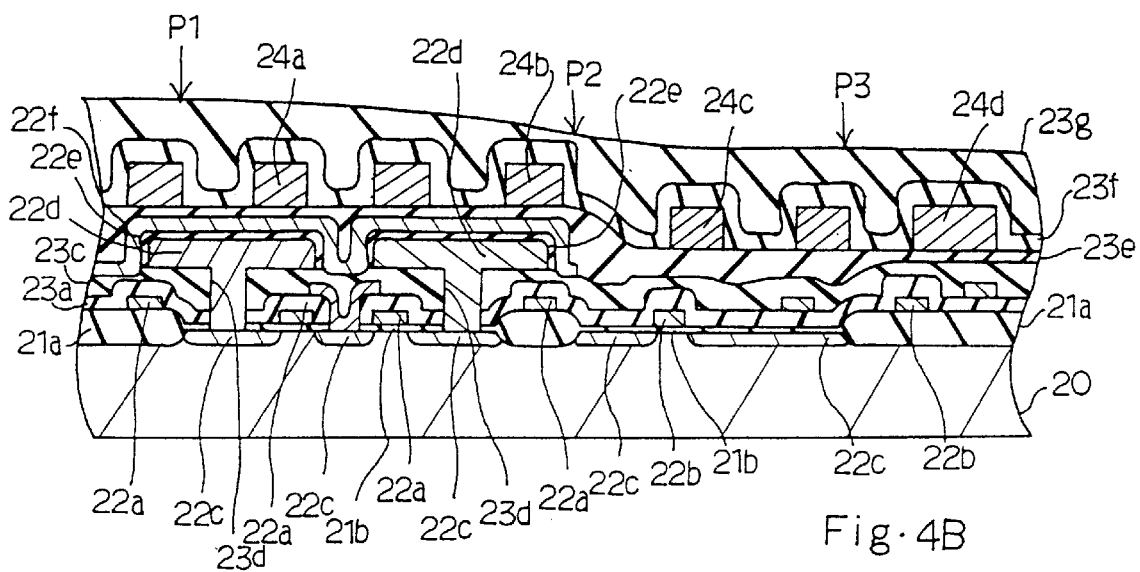

Silica is spun onto the fourth inter-level insulating layer 23f, and the spin-on-glass layer 23g ranges 300 nanometers to 400 nanometers thick. The spin-on-glass layer 23g fills gaps between the lower conductive wirings 24a to 24d, and is gently waved. The thickness of the spin-on-glass layer 23f is different. In this instance, the spin-on-glass layer 23g is thinnest at point P2, and is thickest at point P1. The spin-on-glass layer 23g has an intermediate thickness at point P3. The resultant semiconductor structure is shown in FIG. 4B.

Figure 4C:
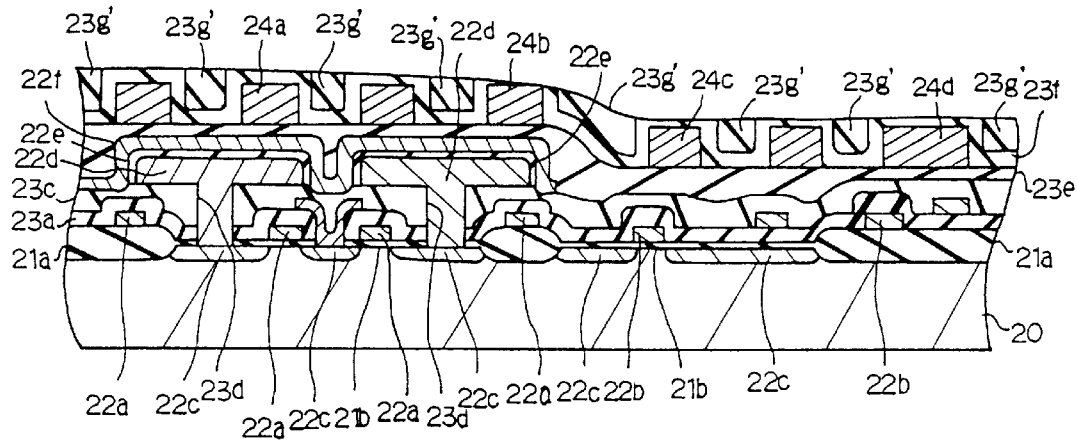
Figure 4D:
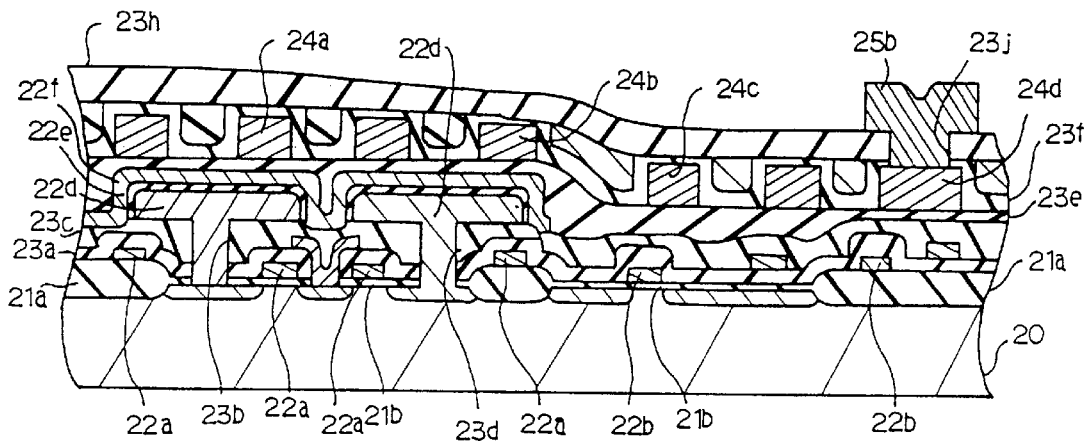

Subsequently, the spin-on-glass layer 23g and the fourth inter-level insulating layer 23f are etched back by using the gaseous etchant containing $CF_4$ and $CHF_3$. The flow rate of $CF_4$ and the flow rate of $CHF_3$ are regulated in such a manner as to have the etching rate to the spin-on-glass layer 23g approximately equal to the etching rate to the fourth inter-level insulating layer 23f. When the lower conductive wiring 24b is exposed, the etching is ended, and the spin-on-glass layers 23g' are left in the recesses between the lower conductive wirings as shown in FIG. 4C. Although the spin-on-glass is perfectly removed from the area over the lower conductive wirings 24a to 24d, the fourth inter-level insulating layer 23f are left on the lower conductive wirings 24a, 24c and 24d.

Subsequently, silicon oxide is deposited to 400 nanometers to 500 nanometers thick over the entire surface of the resultant semiconductor structure by using the plasma-exited chemical vapor deposition, and forms a fifth inter-level insulating layer 23h. Though not shown in the drawings, contact holes 23i/23j are formed in the fifth inter-level insulating layer 23h and the fourth and fifth inter-level insulating layers 23f/23h, and reach the upper surface of the lower conductive wiring 24b and the upper surface of the lower conductive wiring 24d, respectively.

Aluminum is deposited to 800 nanometers to 1000 nanometers thick, and the aluminum layer is patterned into upper conductive wiring 25a by using the lithographic techniques and the etching. The upper conductive wiring 25b is held in contact with the lower conductive wiring 24d through the contact hole 23j formed in the fourth and fifth inter-level insulating layers 23f/23h.

The fifth inter-level insulating layer 23h is so smooth that the aluminum layer is patterned into the fine upper conductive wiring 25b. Although the fourth inter-level insulating layer 23f is left on the upper surface of the lower conductive wiring 24d, the gaseous etchant decreases the thickness of the fourth inter-level insulating layer 23f, and the contact hole 23j is also improved in the aspect ratio.

Although particular embodiments of the present invention have been shown and described, it will be obvious to those skilled in the art that various changes and modifications may be made without departing from the spirit and scope of the present invention.

What is claimed is:

1. A semiconductor device fabricated on a semiconductor substrate, comprising:

at least one lower conductive wiring extending over said semiconductor substrate, and having side surfaces and an upper surface;

a first inter-level insulating layer held in contact with said side surfaces of said at least one lower conductive wiring, and having a first flat upper surface substantially coplanar with said upper surface of said at least one lower conductive wiring and a curved upper surface contiguous to said first flat upper surface and depressed toward said semiconductor substrate;

a spin-on-glass layer filling a space defined by said curved upper surface, and having a second flat upper surface substantially coplanar with said first flat upper surface;

a second inter-level insulating layer formed on said first and second flat surfaces and said upper surface of said at least one lower conductive wiring, and having a contact hole to which said at least one lower conductive wiring is exposed; and an upper conductive wiring extending on said second inter-level insulating layer, and passing through said contact hole so as to be held in contact with said at least one lower conductive wiring.

2. The semiconductor device as set forth in claim 1, in which said first inter-level insulating layer is formed of silicon oxide deposited by using a chemical vapor deposition, and the glass forming said spin-on-glass layer and said silicon oxide forming said first inter-level insulating layer give respective etching rates approximately equal to one another to an etchant.

3. The semiconductor device as set forth in claim 2, in which said etchant contains tetrafluoromethane, trifluoromethane and carrier gas.

4. A semiconductor device fabricated on a semiconductor substrate, comprising:

at least one lower conductive wiring extending over said semiconductor substrate, and having side surfaces and an upper surface;

a first inter-level insulating layer held in contact with said side surfaces of said at least one lower conductive wiring, and having a first flat upper surface substantially coplanar with said upper surface of said at least one lower conductive wiring and a curved semiconductor substrate;

a spin-on-glass layer filling a space defined by said curved upper surface, and having a second flat upper surface substantially coplanar with said first flat upper surface;

a second inter-level insulating layer formed on said first and second flat surfaces and said upper surface of said at least one lower conductive wiring, and having a contact hole to which said at least one lower conductive wiring is exposed;

an upper conductive wiring extending on said second inter-level insulating layer, and passing through said contact hole so as to be held in contact with said at least one lower conductive wiring; and another lower conductive wiring extending over said semiconductor substrate on the same level as said at least one lower conductive wiring and having an upper surface, said first inter-level insulating layer further having a third flat upper surface laminated on said upper surface of said another lower conductive wiring, the thickness of said first inter-level insulating layer on said upper surface of said another lower conductive wiring being thinner than said first inter-level insulating layer on both sides of said another lower conductive wiring, another contact hole being formed in said first and second inter-level insulating layers so that another upper conductive wiring is held in contact with said another lower conductive wiring there through.

5. A semiconductor device fabricated on a substrate, comprising:

at least one lower conductive wiring extending over said semiconductor substrate, and having side surfaces and an upper surface;

a first inter-level insulating layer held in contact with said side surfaces of said at least one lower conductive wiring, and having a first flat upper surface substantially coplanar with said upper surface of said at least one lower conductive wiring and a second surface depressed toward said semiconductor substrate;

a spin-on-glass layer filling a space defined by said depressed area of said first inter-level insulating layer, said spin-on-glass layer being coplanar with said first flat upper surface of said first inter-level insulating layer and said upper surface of said at least one lower conductive wiring;

a second inter-level insulating layer formed on said first flat surface, said spin-on-glass layer and said upper surface of said at least one lower conductive wiring, and having a contact hole to which said at least one lower conductive wiring is exposed; and an upper conductive wiring extending on said second inter-level insulating layer, and passing through said contact hole so as to be held in contact with said at least one lower conductive wiring.

* * * * *